United States Patent
Cheng et al.

(10) Patent No.: US 9,390,925 B1
(45) Date of Patent: Jul. 12, 2016

(54) SILICON—GERMANIUM (SIGE) FIN FORMATION

(71) Applicant: GLOBALFOUNDRIES INC., Grand Cayman (KY)

(72) Inventors: Kangguo Cheng, Schenectady, NY (US); Ali Khakifirooz, Los Altos, CA (US); Alexander Reznicek, Troy, NY (US); Dominic J. Schepis, Wappingers Falls, NY (US)

(73) Assignee: Globalfoundries, Inc., Grand Cayman (KY)

(*) Notice: Subject to any disclaimer, the term of this patent is extended or adjusted under 35 U.S.C. 154(b) by 0 days.

(21) Appl. No.: 14/572,975

(22) Filed: Dec. 17, 2014

(51) Int. Cl.
| H01L 21/00 | (2006.01) |
| H01L 21/225 | (2006.01) |
| H01L 21/8234 | (2006.01) |
| H01L 29/161 | (2006.01) |
| H01L 29/06 | (2006.01) |
| H01L 29/78 | (2006.01) |

(52) U.S. Cl.
CPC .... *H01L 21/2252* (2013.01); *H01L 21/823412* (2013.01); *H01L 21/823431* (2013.01); *H01L 29/0653* (2013.01); *H01L 29/161* (2013.01); *H01L 29/785* (2013.01)

(58) Field of Classification Search
CPC ............... H01L 21/2252; H01L 21/823412; H01L 29/161; H01L 29/0653; H01L 29/785; H01L 21/02532; H01L 29/66795; H01L 21/823821; H01L 27/0924; H01L 21/823431; H01L 27/0886; H01L 27/1211
USPC ........................................... 438/303
See application file for complete search history.

(56) References Cited

U.S. PATENT DOCUMENTS

| 7,323,710 | B2 | 1/2008 | Kim et al. |
| 7,585,752 | B2 | 9/2009 | Todd et al. |
| 7,767,560 | B2 | 8/2010 | Jin et al. |
| 8,048,723 | B2 | 11/2011 | Chang et al. |
| 8,497,177 | B1 | 7/2013 | Chang et al. |
| 8,951,850 | B1 * | 2/2015 | He .................. H01L 29/66795 438/164 |
| 9,299,809 | B2 * | 3/2016 | Brunco ............ H01L 29/66795 |
| 9,299,840 | B2 * | 3/2016 | Xu .................... H01L 29/1054 |
| 2010/0044762 | A1 * | 2/2010 | Orlowski .......... H01L 29/66818 257/288 |
| 2010/0144121 | A1 | 6/2010 | Chang et al. |
| 2011/0147811 | A1 * | 6/2011 | Kavalieros ........ H01L 29/66795 257/288 |
| 2012/0025313 | A1 | 2/2012 | Chang et al. |

FOREIGN PATENT DOCUMENTS

KR      1020100023493 A     3/2010

* cited by examiner

*Primary Examiner* — Thanh T Nguyen
(74) *Attorney, Agent, or Firm* — Yuanmin Cai; Hoffman Warnick LLC

(57) ABSTRACT

Constructing an SiGe fin by: (i) providing an intermediate sub-assembly including a silicon-containing base layer and a silicon-containing first fin structure extending in an upwards direction from the base layer; (ii) refining the sub-assembly by covering at least a portion of the top surface of the base layer and at least a portion of the first and second lateral surfaces of the first fin structure with a pre-thermal-oxidation layer that includes Silicon-Germanium (SiGe); and (iii) further refining the sub-assembly by thermally oxidizing the pre-thermal oxidation layer to migrate Ge content from the pre-thermal-oxidation layer into at least a portion of the base layer and at least a portion of first fin structure.

16 Claims, 4 Drawing Sheets

SILICON—GERMANIUM (SIGE) FIN FORMATION

BACKGROUND OF THE INVENTION

The present invention relates generally to the field of micro-electronics that include fin formations (for example, FINFETs ("Fin field effect transistors")).

A FINFET is a nonplanar, double-gate transistor built on an SOI (silicon on insulator) substrate. The distinguishing characteristic of the FINFET is that the conducting channel passes orthogonally through an elongated, relatively high, relatively thin, fin structure. Typically, the fin structure is made of silicon, although Silicon-Germanium (SiGe) fins are also known. This fin structure forms the body of the device. The thickness of the fin (measured in the direction from source to drain) determines the effective "channel length" of the device. FINFETs can provide better electrical control over the channel, reduce the leakage current and avoid certain unfavorable short-channel effects associated with non-FINFET devices. As used herein, the term "FINFET" means any transistor device with a fin structure located between its source(s) and drain(s), regardless of the number of gates.

It is currently conventional to form SiGe fins by growing a blanket layer (or block) of SiGe and then cutting away material to form the fin structures by SIT (sidewall image transfer).

SUMMARY

According to an aspect of the present invention, a method of refining a semiconductor device under construction includes the following operations (not necessarily in the following order and it is noted that operations may overlap in time): (i) providing an uncovered intermediate sub-assembly including a silicon-containing base layer and a silicon-containing first fin structure extending in an upwards direction from the base layer, with the base layer including a top surface and the first fin structure including a first lateral surface and a second lateral surface; (ii) refining the uncovered intermediate sub-assembly into a covered intermediate sub-assembly by covering at least a portion of the top surface of the base layer of the uncovered intermediate sub-assembly and at least a portion of the first and second lateral surfaces of the first fin structure of the uncovered intermediate sub-assembly with a pre-thermal-oxidation layer that includes Silicon-Germanium (SiGe); and (iii) refining the covered intermediate sub-assembly into a thermally-oxidized intermediate sub-assembly by thermally oxidizing the pre-thermal oxidation layer to migrate Ge content from the pre-thermal-oxidation layer into at least a portion of the base layer and at least a portion of the first fin structure, thereby changing the pre-thermal oxidation layer into a post-thermal oxidation layer.

According to a further aspect of the present invention, a method of refining a semiconductor device under construction includes the following operations (not necessarily in the following order and it is noted that operations may overlap in time): (i) providing an uncovered intermediate sub-assembly including a silicon-containing base layer and a plurality of parallel silicon-containing fin structures each extending in an upwards direction from the base layer, with the base layer including a top surface and each fin structure, of the plurality of fin structures, including a first lateral surface and a second lateral surface; (ii) refining the uncovered intermediate sub-assembly into a covered intermediate sub-assembly by covering at least a portion of the top surface of the base layer of the uncovered intermediate sub-assembly and at least a portion of the first and second lateral surfaces of each fin structure, of the plurality of fin structures of the uncovered intermediate sub-assembly with a pre-thermal-oxidation layer that includes Silicon-Germanium (SiGe); and (iii) refining the covered intermediate sub-assembly into a thermally-oxidized intermediate sub-assembly by thermally oxidizing the pre-thermal oxidation layer to migrate Ge content from the pre-thermal-oxidation layer into at least a portion of the base layer and at least a portion of each fin structure, of the plurality of fin structures, thereby changing the pre-thermal oxidation layer into a post-thermal oxidation layer.

According to a further aspect of the present invention, a semiconductor device under construction includes: a substrate layer; a buried oxide layer; and a first fin structure. The buried oxide layer is located over at least a portion of the substrate layer. The first fin structure is located over a portion of the buried oxide layer. The first fin structure includes Silicon-Germanium (SiGe). The first fin structure is at least 40 nanometers in height.

DETAILED DESCRIPTION

Some embodiments of the present invention are directed to SiGe (silicon germanium) fins for 10 nm (nanometer) technology node FINFETs (fin field effect transistors) to boost pFET (p-type field effect transistor) performance. Some embodiments of the present invention provide a way to robustly form a device with high aspect ratio gate.

Some embodiments of the present invention recognize several challenges for forming SiGe fins: (i) the critical thickness of 25% Ge (germanium) is about 30 nm, less than the fin height requirement for 10 nm (50 nm Hfin (fin height) is needed); (ii) designs that epitaxy SiGe on Si (silicon) fin sidewalls and then perform thermal condensation are subject to the following potential problems: (a) after cladding the oxide on SiGe fin sidewalls has to be removed, but removing oxide from fin sidewalls inevitably attacks BOX (buried oxide layer), causing fin liftoff, and (b) faceted epi (epitaxy) at bottom of Si fin results in non-uniform SiGe fin width, which, in turn, can lead to barrel-shaped SiGe fins. Some embodiments of the present invention recognize one, or more, of the following problems with respect to currently conventional ways of forming SiGe fins: (i) some problems are related to a critical thickness of SiGe grown on Si; (ii) fabrication of silicon germanium alloy fins having 25 atomic percent or greater of germanium is challenging due to the critical thickness of the silicon germanium alloy films with increasing germanium content; and (iii) as an example of the previous item on this list, silicon germanium alloys containing 25 atomic percent to 60 atomic percent germanium have a critical thickness of from 25 nm (nanometers) to 35 nm, and above this critical thickness, defects form to partially relieve the strain in the silicon germanium alloy.

Some embodiments of the present application provides a method for forming silicon germanium alloy fins containing 25 atomic percent or greater germanium. Such silicon germanium alloy fins containing 25 atomic percent or greater germanium are referred to herein as "high percentage silicon germanium (SiGe) fins."

Some embodiments of the present invention may include one, or more, of the following features, characteristics and/or advantages: (i) high Ge % SiGe fins (that is, fins made of SiGe with a relatively large proportion of Ge) can be formed with the fin height exceeding the critical thickness of SiGe of SiGe fins form by prior art methods (cut out of block); (ii) no BOX undercut; and/or (iii) more uniform SiGe fins.

A method of fabricating a fin-based micro electronics device, according to the present invention, will now be discussed with reference to FIG. 1A to 1G (respectively showing intermediate assemblies 100a to 100g).

Figure 1A:
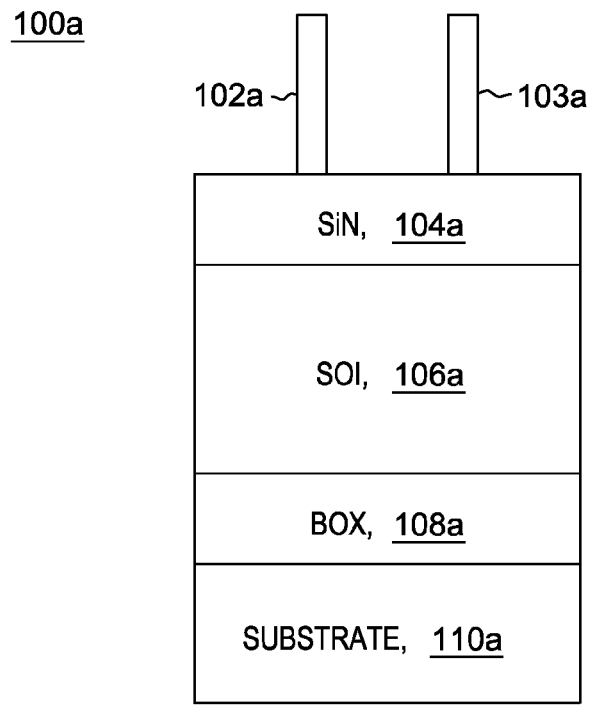
FIG. 1A is a cross-sectional view of a first embodiment of a semi-conductor device according to the present invention as it is being fabricated.

As shown in FIG. 1A, assembly 100a is first provided, including: oxide (also called hardmask) layer 102a; silicon nitride (SiN) layer 104a; silicon-on-insulator (SOI) layer 106a (in this example, the SOI layer is ~50 nm in thickness); buried oxide (BOX) layer 108a; and substrate layer 110a. SiN layer 104a is a pad film. Hardmask layer 102a, 103a is formed by any fin patterning method now known (for example, SIT (sidewall image transfer (lithography fin patterning method)) or to be developed in the future. Intermediate sub-assembly 100a is an example of a type of sub-assembly sometimes referred to herein as a "finless intermediate sub-assembly."

Figure 1B:
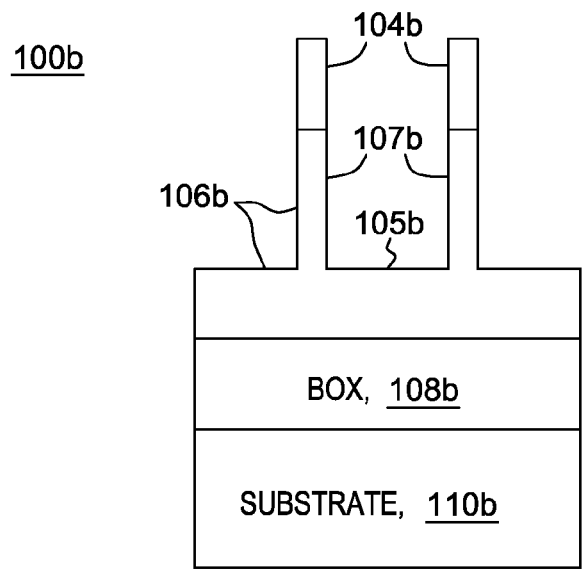
FIG. 1B is another cross-sectional view of the first embodiment of a two fin semi-conductor device as it is being fabricated.

As shown by comparing FIGS. 1A and 1B, intermediate assembly 100a is transformed into intermediate assembly 100b, including: SiN layer 104b; SOI layer 106b (including flat portion 105b and upstanding portions 107b); BOX layer 108b; and substrate layer 110b. More specifically, intermediate assembly 100a is transformed into intermediate assembly 100b by: (i) removing exposed areas of the SiN layer and part of the exposed areas of the SOI layers by reactive ion etching; and (ii) removing hardmask layer 102a by wet etch stripping using HF (aqueous hydrofluoric acid). More specifically, in this example, the reactive ion etching process is controlled so that exposed areas of the SOI layer are reduced from about 50 nm to about 10 nm in thickness. Intermediate sub-assembly 100b is an example of a type of sub-assembly sometimes herein referred to as an "uncovered intermediate sub-assembly."

Figure 1C:
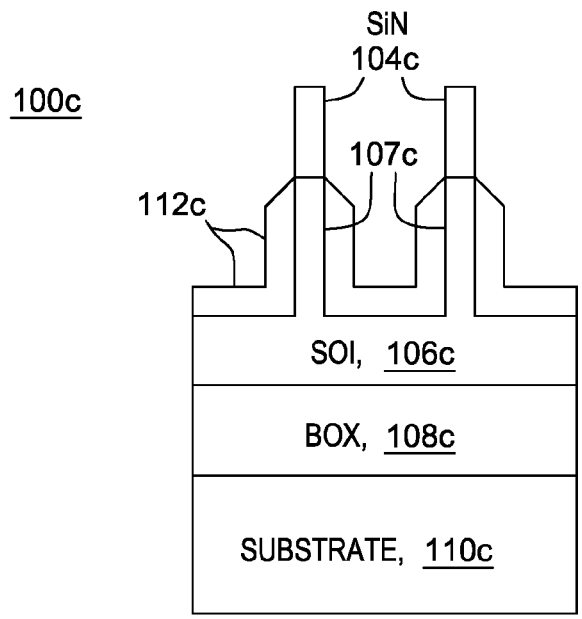
FIG. 1C is another cross-sectional view of the first embodiment of a two fin semi-conductor device as it is being fabricated.

As shown by comparing FIGS. 1B and 1C, intermediate assembly 100b is transformed into intermediate assembly 100c, including: SiN layer 104c; SOI layer 106c (including flat portion (no separate reference numeral) and upstanding portions 107c); BOX layer 108c; substrate layer 110c; and pre-thermal oxidation SiGe layer 112c. More specifically, intermediate assembly 100b is transformed into intermediate assembly 100c by epitaxially growing SiGe layer 112c over the exposed surfaces of SOI layer 106c. The SiGe growth is like eSiGe (embedded silicon-germanium) growth so that the fin bottom is not faceted. Intermediate sub-assembly 100c is an example of a type of sub-assembly sometimes referred to herein as a "covered intermediate sub-assembly."

Figure 2:
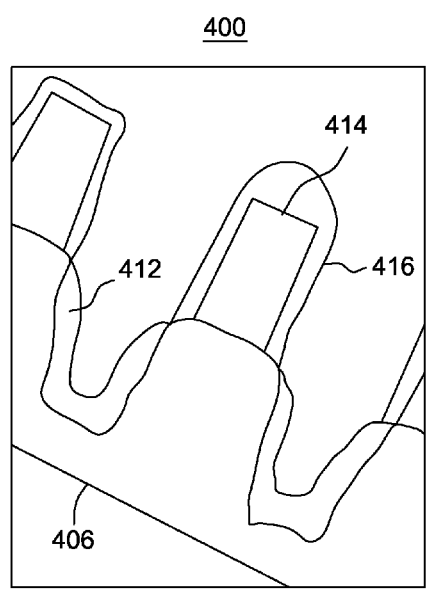
FIG. 2 is cross-sectional view of a semi-conductor device helpful in understanding the present invention.
Figure 3:
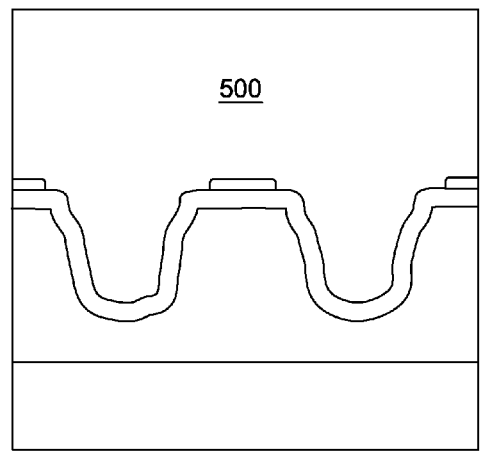
FIG. 3 is a cross-sectional view of a semi-conductor device helpful in understanding the present invention.

Some sample profiles of the SiGe layer are shown at FIG. 2 (assembly 400 including SOI layer 406, pre-thermal oxidation SiGe layer 412, gate 414, and gate spacer 416) and FIG. 3 (intermediate assembly 500).

Figure 1D:
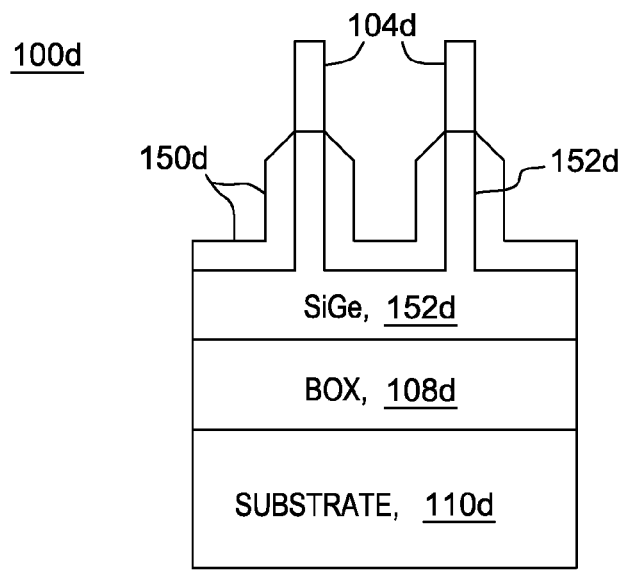
FIG. 1D is another cross-sectional view of the first embodiment of a two fin semi-conductor device as it is being fabricated.

As shown by comparing FIGS. 1C and 1D, intermediate assembly 100c is transformed into intermediate assembly 100d, including: SiN layer 104d; BOX layer 108d; substrate layer 110d; silicon dioxide layer 150d; and post-thermal oxidation SiGe layer 152d. Sub-assembly 100d is an example of a type of sub-assembly sometimes referred to herein as a "thermally-oxidized intermediate sub-assembly."

More specifically, intermediate assembly 100c is transformed into intermediate assembly 100d by performing thermal oxidation (that is, SiGe condensation) so that some of the Ge atoms of pre-thermal oxidation SiGe layer 112c diffuse: (i) out of pre-thermal oxidation SiGe layer 112c to form silicon dioxide layer 150d (because oxygen atoms displace Ge atoms in layer 150d as a result of the condensation; and (ii) into SOI layer 106c to form post-thermal oxidation SiGe layer 152d (while post-thermal oxidation SiGe layer 152d is referred to here as a "layer," as can be seen in FIG. 1D, this "layer" includes tall, thin fin structure portions). To explain item (i) on the foregoing list in fuller and more precise terms, oxidation and condensation happens at the same time. Once the semiconductor fabrication process anneals the structure, the Ge diffuses into the Si-fin. At the same time the Si oxidizes at the fin surface, forming silicon oxide. Silicon gets preferably oxidized compared to the Ge due to the electronegativity (this can be seen from the Periodic Table Of The Elements). So, while the Si oxidizes, it gets consumed, increasing the Ge at the surface. Due to the Ge gradient, the Ge has a tendency to diffuse into a region of lower Ge concentration. Similarly, the Si tends to diffuse towards a region of lower Si concentration. Accordingly, the Ge goes toward the fin center, whereas the Si goes to the fin surface, where it is consumed by oxidation.

An example of a thermal oxidation process, of a type that can be used in conjunction with some embodiments of the present invention, will now be discussed. The thermal condensation is a thermal oxidation process that is performed at temperature sufficient enough to cause diffusion of germanium out of an epitaxial SiGe layer and into a pure silicon (or SiGe) layer. In this example, the thermal condensation is performed at a temperature from 700° C. to 1300° C. In another example, the thermal condensation is performed at a temperature from 1000° C. to 1200° C. In this example, the thermal condensation is performed in an oxidizing ambient which includes at least one oxygen-containing gas such as O2, NO, N2O, ozone, air and other like oxygen-containing gases. The oxygen-containing gas may be admixed with each other (such as an admixture of O2 and NO), or the gas may be diluted with an inert gas such as He, Ar, $N_2$, Xe, Kr, or Ne. In this example, the thermal condensation process may be carried out for a variable period of time. Typically, the thermal condensation process is carried out for a time period from 5 seconds to about 5 hours, depending on thermal oxidation temperature and oxidation species. The thermal condensation process may be carried out at a single targeted temperature, or various ramp and soak cycles using various ramp rates and soak times can be employed.

Figure 1E:
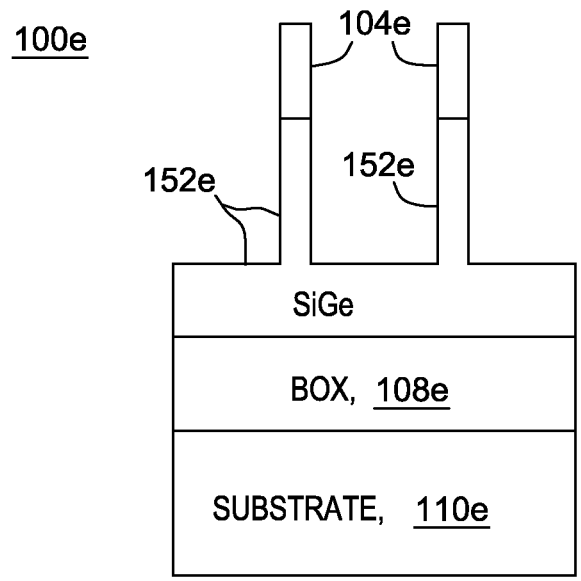
FIG. 1E is another cross-sectional view of the first embodiment of a two fin semi-conductor device as it is being fabricated.

As shown by comparing FIGS. 1D and 1E, intermediate assembly 100d is transformed into intermediate assembly 100e, including: SiN layer 104e; BOX layer 108e; substrate layer 110e; and post-thermal oxidation SiGe layer 152e.

More specifically, intermediate assembly 100d is transformed into intermediate assembly 100e by wet etch stripping silicon dioxide layer 150d using HF. Note that BOX layer 108e is protected by post-thermal oxidation SiGe 152e layer during this oxide strip process, so no BOX undercut occurs in this example. Intermediate sub-assembly 100e is an example of a type of sub-assembly sometimes herein referred to as an "oxidation-by-product-free intermediate sub-assembly."

Figure 1F:
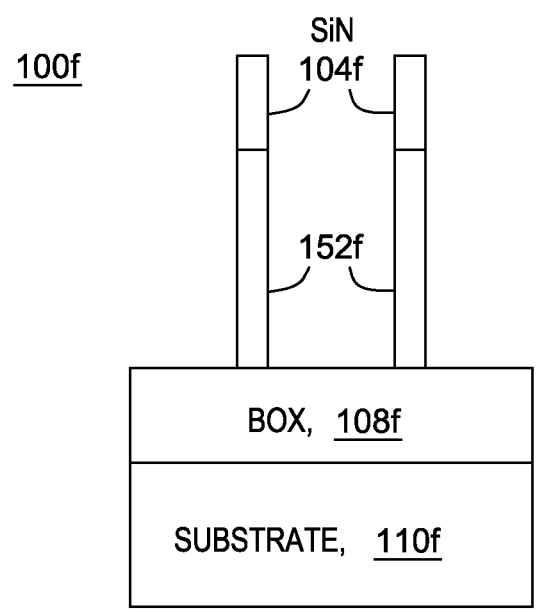
FIG. 1F is another cross-sectional view of the first embodiment of a two fin semi-conductor device as it is being fabricated.

As shown by comparing FIGS. 1E and 1F, intermediate assembly 100e is transformed into intermediate assembly 100f, including: SiN layer 104f; BOX layer 108f; substrate layer 110f; and post-thermal oxidation SiGe layer 152f. More specifically, exposed areas of post-thermal oxidation SiGe layer 152e are removed by reactive ion etching (RIE) so that only the upstanding portions (that is, the fin structures) remain in post-thermal oxidation SiGe layer 152f. As can be seen by comparing FIGS. 1E and 1F, SiN layer 104e is used as a mask during the RIE. Intermediate sub-assembly 100f is an example of a type of sub-assembly sometimes herein referred to as a "base-layer-free intermediate sub-assembly."

Figure 1G:
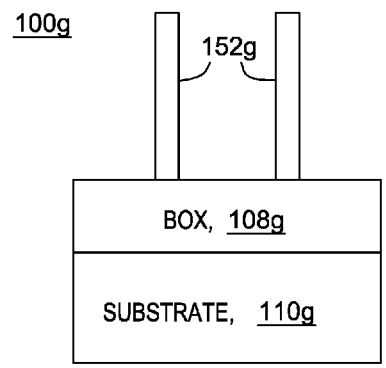
FIG. 1G is another cross-sectional view of the first embodiment of a two fin semi-conductor device as it is being fabricated.

As shown by comparing FIGS. 1F and 1G, intermediate assembly 100f is transformed into intermediate assembly 100g, including: BOX layer 108g; substrate layer 110g; and post-thermal oxidation SiGe layer 152g (also referred to as "SiGe fins"). More specifically, SiN layer 104f is wet etch stripped away using hot phosphoric acid to expose the top surfaces of SiGe fins 152g. Intermediate sub-assembly 100g is an example of a type of intermediate sub-assembly sometimes herein referred to as an "unmasked-SiGe-fin intermediate sub-assembly."

Some embodiments of the present invention may include one, or more, of the following features, characteristics and/or advantages: (i) no BOX undercut; (ii) more uniform SiGe fins; (iii) enable tall SiGe fins with high Ge %; (iv) method and structure for tall uniform SiGe fins without BOX gauging; and/or (v) formation of a SiGe FINFET on SOI.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed is:

1. A method of refining a semiconductor device under construction, the method comprising:
    providing an uncovered intermediate sub-assembly including a silicon-containing base layer and a silicon-containing first fin structure extending in an upwards direction from the base layer, with the base layer including a top surface and the first fin structure including a first lateral surface and a second lateral surface;
    refining the uncovered intermediate sub-assembly into a covered intermediate sub-assembly by covering at least a portion of the top surface of the base layer of the uncovered intermediate sub-assembly and at least a portion of the first and second lateral surfaces of the first fin structure of the uncovered intermediate sub-assembly with a pre-thermal-oxidation layer that includes Silicon-Germanium (SiGe); and
    refining the covered intermediate sub-assembly into a thermally-oxidized intermediate sub-assembly by thermally oxidizing the pre-thermal oxidation layer to migrate Ge content from the pre-thermal-oxidation layer into at least a portion of the base layer and at least a portion of first fin structure, thereby changing the pre-thermal oxidation layer into a post-thermal oxidation layer.

2. The method of claim 1 further comprising:
    providing a finless intermediate sub-assembly including a silicon-containing base/fin layer; and
    refining the finless intermediate sub-assembly into the uncovered intermediate sub-assembly by selectively removing material from the base/fin layer to form the base layer and the first fin structure extending from the base layer.

3. The method of claim 2 wherein:
    in the finless intermediate sub-assembly, the silicon-containing base/fin layer is made of silicon and is located on top of a buried oxide layer;
    in the uncovered intermediate sub-assembly, the base layer and first fin structure are made of silicon and the base layer is located on top of the buried oxide layer;
    in the covered intermediate sub-assembly, the base layer and first fin structure are made of silicon and the base layer is located on top of the buried oxide layer; and
    in the thermally-oxidized intermediate sub-assembly, at least a portion of the base layer and at least a portion of the first fin structure are made of SiGe due to migration of Ge content during the thermal oxidation step.

4. The method of claim 3 further comprising:
    refining the thermally-oxidized intermediate sub-assembly into oxidation-by-product-free intermediate sub-assembly by removing the post-thermal oxidation layer.

5. The method of claim 4 wherein:
    the removal of the post-thermal oxidation layer is performed by application of a stripping agent that removes the post-thermal oxidation layer, but does not remove the base layer or first fin structure so that the base layer and first fin structure protect the buried oxide layer from the stripping agent.

6. The method of claim 5 wherein:
    the first fin structure further includes a top surface; and
    the thermally-oxidized intermediate sub-assembly further includes a hardmask layer located on top of the top surface of the first fin layer;
    the method further comprising:
    refining the oxidation-by-product-free intermediate sub-assembly into a base-layer-free intermediate sub-assembly by performing an etch process on the oxidation-by-product-free intermediate sub-assembly to remove the base layer, while retaining the hard mask layer and the first fin structure underlying the hardmask layer.

7. The method of claim 6 further comprising:
refining the base-layer-free intermediate sub-assembly into an unmasked-SiGe-fin sub-assembly by removing the hardmask layer.

8. The method of claim 2 wherein:
the finless intermediate sub-assembly further includes a hardmask layer located over a portion of a top surface of the silicon-containing base/fin layer; and
the refinement of the finless intermediate sub-assembly into the uncovered intermediate sub-assembly selectively removes material from the base/fin layer by etching so that: (i) a portion of the silicon-containing base/fin layer that is not located under the hardmask layer is removed to define the first and second lateral surfaces of the first fin structure, and (ii) a portion of the silicon-containing base/fin layer that is located under the hardmask layer is not removed and becomes the first fin structure.

9. The method of claim 1 wherein:
the step of covering at least a portion of the top surface of the base layer of the uncovered intermediate sub-assembly and at least a portion of the first and second lateral surfaces of the first fin structure of the uncovered intermediate sub-assembly with a pre-thermal-oxidation layer is performed by epitaxially growing the pre-thermal-oxidation layer.

10. The method of claim 9 wherein:
the epitaxial growth is performed so that the pre-thermal-oxidation layer is not faceted.

11. The method of claim 9 wherein the pre-thermal-oxidation layer is at least substantially constituted by SiGe.

12. The method of claim 1 wherein:
the pre-thermal-oxidation layer is at least substantially constituted by SiGe; and
the post-thermal-oxidation layer includes silicon dioxide.

13. The method of claim 1 wherein the thermal oxidation is performed according to one of the following temperature patterns: constant temperature, or temperature controlled to vary in a predetermined manner.

14. A method of refining a semiconductor device under construction, the method comprising:
providing an uncovered intermediate sub-assembly including a silicon-containing base layer and a plurality of parallel silicon-containing fin structures each extending in an upwards direction from the base layer, with the base layer including a top surface and each fin structure, of the plurality of fin structures, including a first lateral surface and a second lateral surface;
refining the uncovered intermediate sub-assembly into a covered intermediate subassembly by covering at least a portion of the top surface of the base layer of the uncovered intermediate sub-assembly and at least a portion of the first and second lateral surfaces of each fin structure, of the plurality of fin structures of the uncovered intermediate sub-assembly with a pre-thermal-oxidation layer that includes Silicon-Germanium (SiGe); and
refining the covered intermediate sub-assembly into a thermally-oxidized intermediate sub-assembly by thermally oxidizing the pre-thermal oxidation layer to migrate Ge content from the pre-thermal-oxidation layer into at least a portion of the base layer and at least a portion of each fin structure, of the plurality of fin structures, thereby changing the pre-thermal oxidation layer into a post-thermal oxidation layer.

15. The method of claim 14 further comprising:
providing a finless intermediate sub-assembly including a silicon-containing base/fin layer; and
refining the finless intermediate sub-assembly into the uncovered intermediate sub-assembly by selectively removing material from the base/fin layer to form the base layer and the plurality of fin structures extending from the base layer.

16. The method of claim 15 wherein:
in the finless intermediate sub-assembly, the silicon-containing base/fin layer is made of silicon and is located on top of a buried oxide layer;
in the uncovered intermediate sub-assembly, the base layer and plurality of fin structures are made of silicon and the base layer is located on top of the buried oxide layer;
in the covered intermediate sub-assembly, the base layer and plurality of fin structures are made of silicon and the base layer is located on top of the buried oxide layer; and
in the thermally-oxidized intermediate sub-assembly, at least a portion of the base layer and at least a portion of each fin structure, of the plurality of fin structures, are made of SiGe due to migration of Ge content during the thermal oxidation step.

* * * * *